(12) United States Patent
Park et al.

(10) Patent No.: US 9,985,659 B2
(45) Date of Patent: May 29, 2018

(54) ERROR CORRECTION PROCESSING CIRCUIT IN MEMORY AND ERROR CORRECTION PROCESSING METHOD

(71) Applicant: KOREA UNIVERSITY RESEARCH AND BUSINESS FOUNDATION, Seoul (KR)

(72) Inventors: Jong Sun Park, Seoul (KR); Jang Won Park, Seoul (KR)

(73) Assignee: KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 294 days.

(21) Appl. No.: 14/810,749

(22) Filed: Jul. 28, 2015

(65) Prior Publication Data
US 2015/0331741 A1    Nov. 19, 2015

Related U.S. Application Data

(63) Continuation of application No. PCT/KR2014/001926, filed on Mar. 10, 2014.

(30) Foreign Application Priority Data

Mar. 8, 2013    (KR) .................... 10-2013-0025034

(51) Int. Cl.
*H03M 13/35* (2006.01)
*G06F 11/10* (2006.01)
(Continued)

(52) U.S. Cl.
CPC ......... *H03M 13/35* (2013.01); *G06F 11/1004* (2013.01); *G06F 11/1048* (2013.01);
(Continued)

(58) Field of Classification Search
CPC .. H03M 13/35; H03M 13/155; H03M 13/152; H03M 13/1545; H03M 13/05;
(Continued)

(56) References Cited

U.S. PATENT DOCUMENTS 7,581,154 B2 * 8/2009 Rai .................. G11C 11/417
714/758
8,898,548 B1 * 11/2014 Mullendore ........ G06F 11/1048
365/185.09
(Continued)

FOREIGN PATENT DOCUMENTS

| JP | 2010191761 | 9/2010 |
|---|---|---|
| KR | 1019950033822 | 12/1995 |
| KR | 1020090091179 | 8/2009 |
| KR | 1020110100465 | 9/2011 |
| KR | 1020120096749 | 8/2012 |

OTHER PUBLICATIONS

International Search Report—PCT/KR2014/001926 dated Jun. 5, 2014.

*Primary Examiner* — Cynthia Britt
(74) *Attorney, Agent, or Firm* — Cantor Colburn LLP

(57) ABSTRACT

A method for correcting error in a memory comprises setting a protected scope for at least part of unit data to be written in the memory according to an operation voltage of the memory; implementing error correction encoding for protected data corresponding to the protected scope among the unit data; and writing the unit data in the memory while matching them with parity data generated as a result of the error correction encoding.

10 Claims, 15 Drawing Sheets

(51) Int. Cl.
    *H03M 13/05*     (2006.01)
    *H03M 13/00*     (2006.01)
    *H03M 13/15*     (2006.01)

(52) U.S. Cl.
    CPC ......... *H03M 13/05* (2013.01); *H03M 13/152* (2013.01); *H03M 13/155* (2013.01); *H03M 13/1545* (2013.01); *H03M 13/611* (2013.01)

(58) Field of Classification Search
    CPC .............. H03M 13/611; G06F 11/1004; G06F 11/1048
    USPC .................................................. 714/764, 774
    See application file for complete search history.

(56) References Cited

U.S. PATENT DOCUMENTS

| | | | | |
|---|---|---|---|---|
| 2012/0036411 | A1* | 2/2012 | Ito | G06F 11/106 714/754 |
| 2012/0284586 | A1* | 11/2012 | Wang | G11C 7/1006 714/763 |
| 2014/0258805 | A1* | 9/2014 | Casado | H03M 13/35 714/758 |
| 2015/0106671 | A1* | 4/2015 | Guo | G11C 5/147 714/721 |
| 2015/0248316 | A1* | 9/2015 | Mogul | G06F 11/073 714/6.11 |
| 2016/0196179 | A1* | 7/2016 | Zhao et al. | H03M 13/356 714/764 |
| 2016/0301428 | A1* | 10/2016 | Andrade Costa | H03M 13/356 |

\* cited by examiner

ERROR CORRECTION PROCESSING CIRCUIT IN MEMORY AND ERROR CORRECTION PROCESSING METHOD

CROSS-REFERENCE TO RELATED APPLICATION

This Application is a continuation application of PCT Application No. PCT/KR2014/001926 filed on Mar. 10, 2014, which claims the benefit of Korean Patent Application No. 10-2013-0025034 filed on Mar. 8, 2013, the entire disclosures of which are incorporated herein by reference.

TECHNICAL FIELD

The embodiments described herein pertain generally to a circuit and a method for processing an error, in particular, a circuit and a method for correcting and processing an error occurring in a memory.

BACKGROUND ART

An error correction code (ECC) refers to an encoding (channel encoding) method for incorporating enough redundant information into a data block to be transmitted such that a receiver can deduce what characters to be transmitted are. The error correction code is essential in digital communication, and has been applied even to the inside of hardware for data storage and transmission.

FIG. 1 is a diagram for describing a concept of an error occurring in a memory and an error correction processing circuit for correcting and processing the error.

As in FIG. 1, input data pass a write circuit in order to be written in a memory cell within a channel, and output data are read out from the memory cell via a readout circuit. In this case, an error may occur in the memory including the write circuit, the readout circuit and the memory cell. In order to correct the error, a circuit, to which the error correction code is applied, may be connected.

Korean Patent Application Publication No. 2009-0091179 (Title of Invention: ECC Protection Apparatus, Method and System Having Small Data Structure) describes an error correction code engine that supports an error correction operation for data structures in different sizes.

Meanwhile, in recent, many studies have been conducted with regard to low power hardware. In this case, a method of lowering an operation voltage of hardware may be the most effective.

However, there is a problem in that probability of occurrence of an error increases as in FIG. 2 as the operation voltage of the memory is lowered. FIG. 2 is a graph showing error probability varying depending on an operation voltage of a memory. That is, when an operation voltage of hardware is reduced, power consumption can be reduced, but probability of occurrence of an error at the vicinity of the memory increases, and thereby, deteriorating whole output quality.

SUMMARY OF THE INVENTION

In order to solve the foregoing problems, some example embodiments provide an error correction processing circuit and an error correction processing method, which are capable of preferentially correcting an error occurring in highly important data among data to be written in a memory according to the degree of error occurrence.

In addition, some example embodiments provide an error correction processing circuit and an error correction processing method, which are capable of reducing whole power consumption by turning off some components of a decoder implementing decoding.

However, the problems sought to be solved by the present disclosure are not limited to the above description, and other problems can be clearly understood by those skilled in the art from the following description.

In an example embodiment, a method for correcting error in a memory comprises setting a protected scope for at least part of unit data to be written in the memory according to an operation voltage of the memory; implementing error correction encoding for protected data corresponding to the protected scope among the unit data; and writing the unit data in the memory while matching them with parity data generated as a result of the error correction encoding.

In another example embodiment, a circuit for correcting error in a memory, comprises a protected scope setting unit that sets a protected scope for at least part of unit data to be written in the memory according to an operation voltage of the memory; an encoder that implements error correction encoding for protected data corresponding to the protected scope among the unit data; and a writer that writes the unit data in the memory while matching them with parity data generated as a result of the error correction encoding.

The error correction processing circuit and the error correction processing method according to an example embodiment are advantageous in that they can minimize power consumption and calculation result errors, by implementing error correction encoding for protected data corresponding to a protected scope among unit data.

Further, the error correction processing circuit and the error correction processing method according to an example embodiment can clearly correct an error occurring in protected data, by implementing error correction decoding for protected data, for which error correction encoding has been implemented, based on read-out parity data and information about a protected scope. In addition, an example embodiment can reduce whole power consumption by turning off unnecessary components, in implementing error correction decoding.

DETAILED DESCRIPTION OF THE INVENTION

Figure 1:
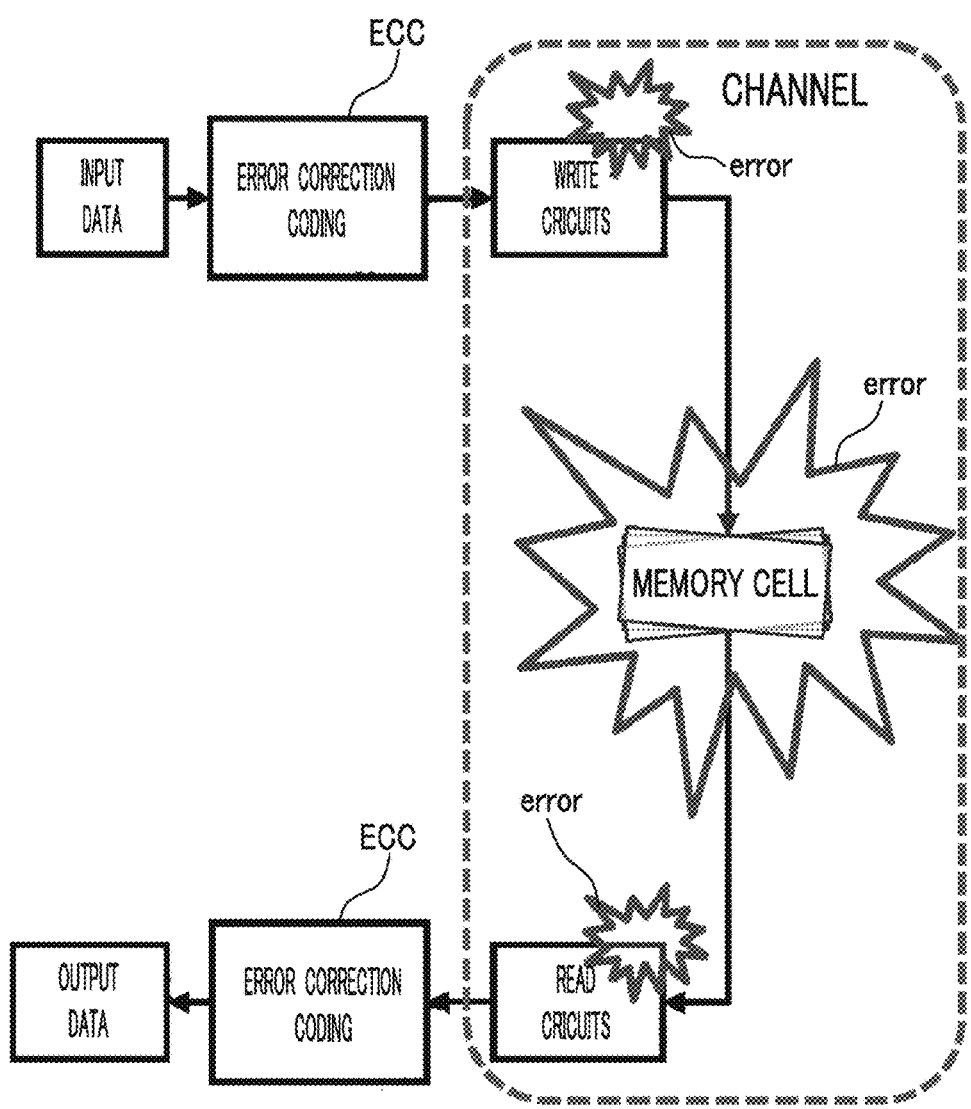
FIG. 1 is a diagram for describing a concept of an error occurring in a memory and an error correction processing circuit for correcting and processing the error.
Figure 2:
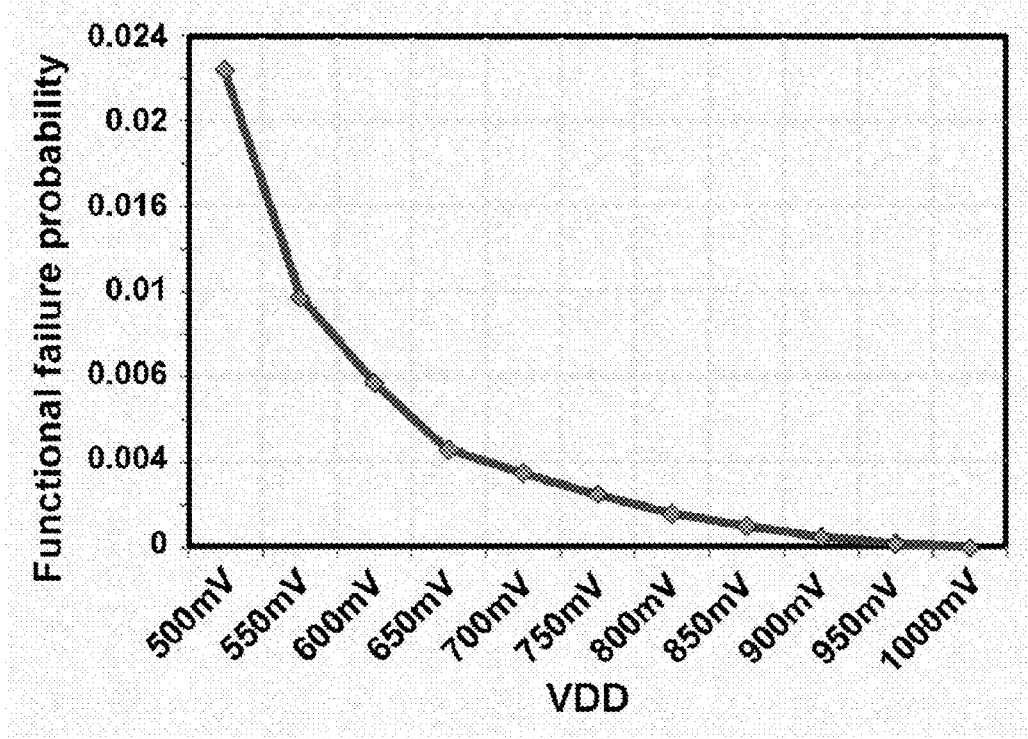
FIG. 2 is a graph showing error probability varying depending on an operation voltage of a memory.

Hereinafter, example embodiments will be described in detail with reference to the accompanying drawings so that inventive concept may be readily implemented by those skilled in the art. However, it is to be noted that the present disclosure is not limited to the example embodiments but can be realized in various other ways. In the drawings, certain parts not directly relevant to the description are omitted to enhance the clarity of the drawings, and like reference numerals denote like parts throughout the whole document.

Throughout the whole document, the term "comprises or includes" and/or "comprising or including" used in the document means that one or more other components, steps, operations, and/or the existence or addition of elements are not excluded in addition to the described components, steps, operations and/or elements.

Figure 3:
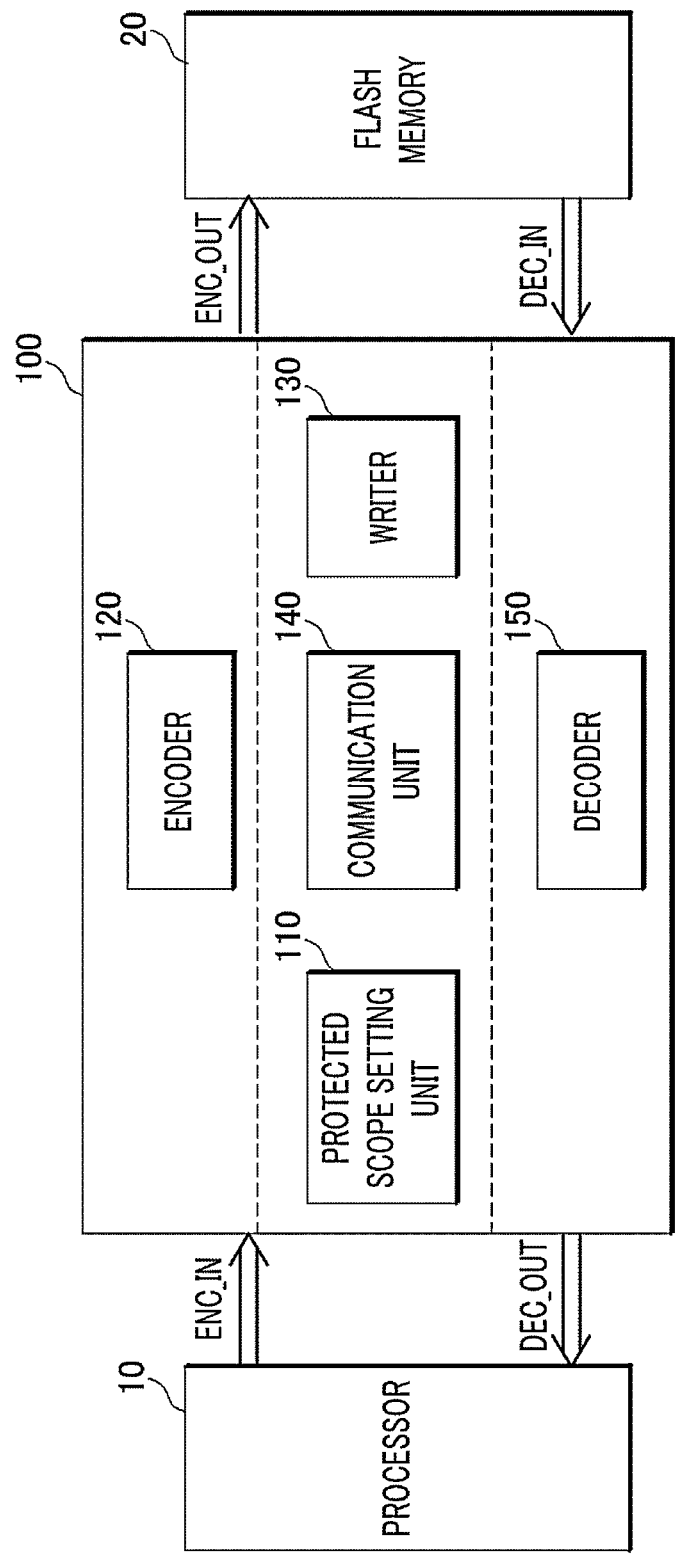
FIG. 3 is a block diagram illustrating a whole structure of an error correction processing circuit according to an example embodiment.

FIG. 3 is a block diagram illustrating a whole structure of an error correction processing circuit according to an example embodiment.

An error correction processing circuit 100 is a circuit for correcting and processing an error occurring in a memory, and includes a protected scope setting unit 110, an encoder 120, a writing unit 130, a communication unit 140 and a decoder 150.

The error correction processing circuit 100 is provided between a processor 10 and a memory 20 and can process and deliver data including encoded data and decoded data. However, since the error correction processing circuit 100 illustrated in FIG. 3 is merely one example embodiment that can be realized, the present disclosure is not limited to the error correction processing circuit 100 illustrated in FIG. 3, and the components or circuits implementing operations of the components may be realized in the separated state to be connected to one another.

Figure 4:
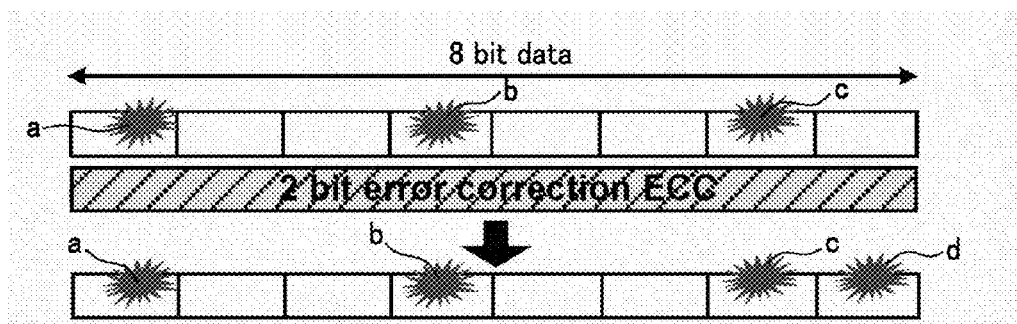
FIG. 4 illustrates diagrams for describing unit data, protected data, and unprotected data.
Figure 4:
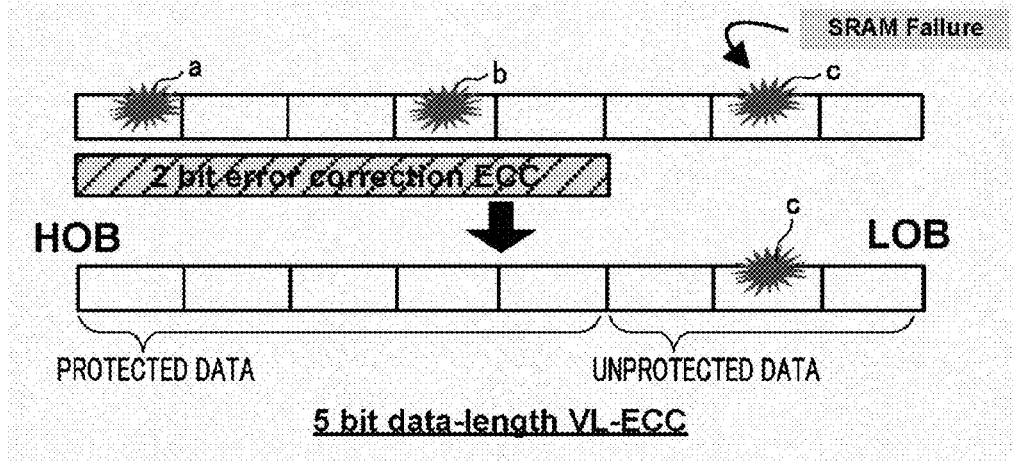

Specifically, prior to describing each of the components included in the error correction processing circuit 100, terms used throughout this document are described with reference to FIG. 4. FIG. 4 illustrates diagrams for describing unit data, protected data and unprotected data.

Data to be written in the memory 20 are referred-to as "unit data" in this document, and may be data to be delivered from the processor 10 to the memory 20, and FIG. 4 illustrates an example for unit data consisting of 8 bits. In this case, as illustrated in FIG. 4, a multiple number of errors like 'a', 'b' and 'c' may variably occur in the unit data depending on the application state or environment. In addition, these errors may exceed maximum bits (e.g., 2 bits or a preset bit value) that can be corrected and processed by the error correction processing circuit 100. In this case, it becomes impossible to correct and process all the errors occurring in the unit data, and an additional error like 'd' may occur as shown in the upper diagram of FIG. 4.

Accordingly, the error correction processing circuit 100 according to an example embodiment corrects and processes an error occurring in unit data in consideration of a scope that can be corrected and processed. In this case, a "protected scope" means a numbers of bits of the unit data protected by ECC and the protected bits are adjacent to each other. The protected scope is set by the protected scope setting unit 110. The protected scope is closely related to an operation voltage and a variable data length structure. In addition, in this document, a scope beyond the protected scope is referred-to as an "unprotected scope." As illustrated in the lower diagram of FIG. 4, among the unit data, data corresponding to the protected scope may be protected data, and data corresponding to the unprotected scope may be unprotected data. That is, errors a and b occurring in the protected data are corrected by the error correction processing circuit 100, but an error c occurring in the unprotected data is not corrected by the error correction processing circuit 100. This is a result of intentionally reducing a length of data that can be corrected and processed in the error correction processing circuit 100, and accordingly, the error occurrence probability can be significantly reduced.

Hereinafter, a specific operation of each of the components illustrated in FIG. 3 is described.

The protected scope setting unit 110 sets a protected scope for at least part of unit data to be written in the memory 20 according to an operation voltage of the memory 20. That is, when an error occurs in certain data, and the protected scope set by the protected scope setting unit 110 includes the certain data, the error correction processing circuit 100 according to an example embodiment may clearly correct and process the error occurring in the certain data. The protected scope set by the protected scope setting unit 110 may vary depending on an operation voltage of the memory 20. For example, when an operation voltage of the memory 20 is 1,000 mV, the protected scope setting unit 110 may set a first protected scope, and when an operation voltage of the memory 20 is 700 mV, the protected scope setting unit 110 may set a second protected scope, which may be smaller than the first protected scope.

The encoder 120 implements error correction encoding for the protected data corresponding to the protected scope among the unit data, and generates parity data through the error correction encoding. That is, the encoder 120 may implement error correction encoding for the protected data among the unit data, and may not implement error correction encoding for the unprotected data. Accordingly, error correction decoding, which will be described later, may be necessary only for the protected data, for which error correction encoding has been implemented, and an error occurring in the protected data may be corrected and processed through the error correction decoding.

Figure 5:
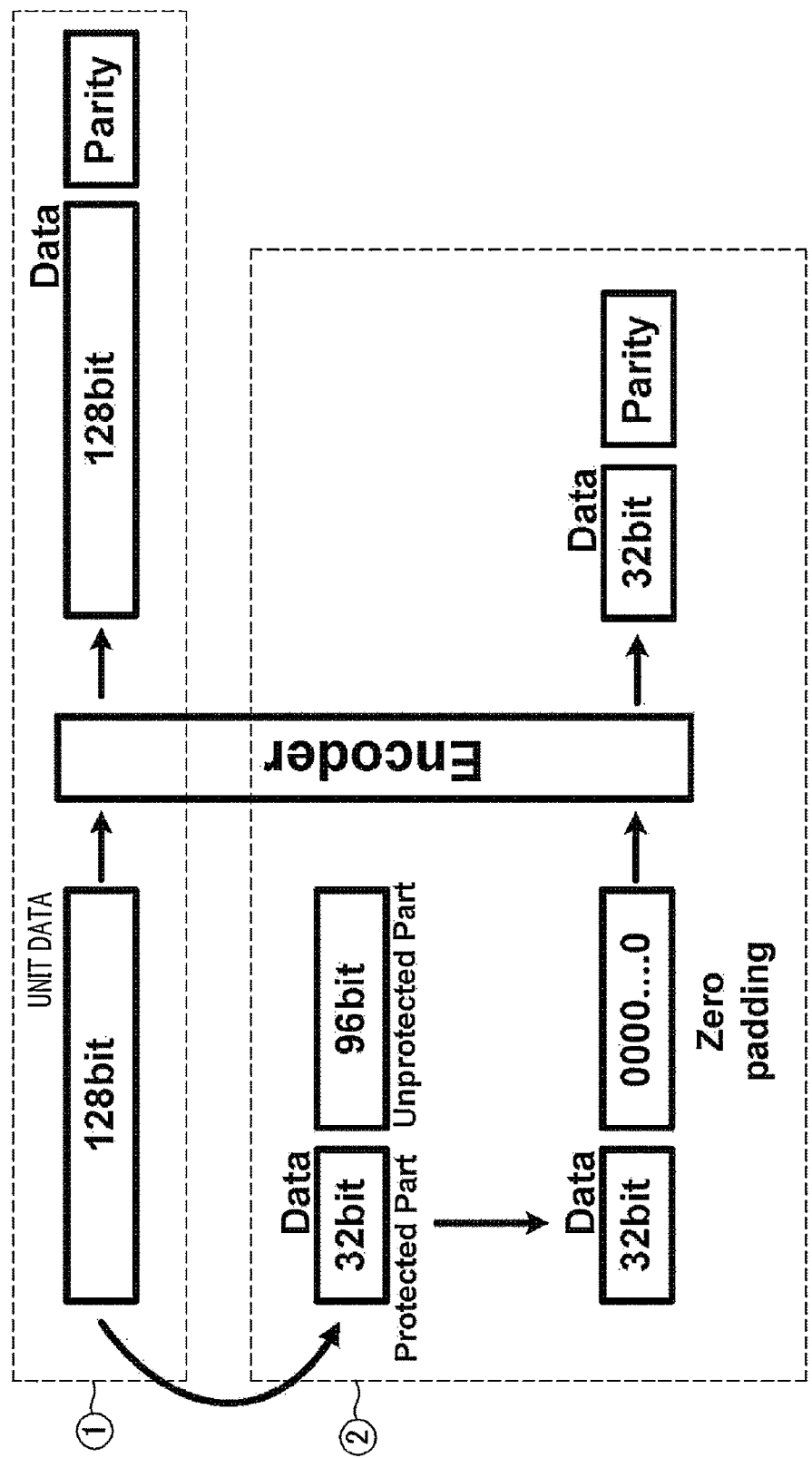
FIG. 5 is a diagram for describing an operation of an encoder among the components illustrated in FIG. 3.

Specifically, the encoder 120 may implement error correction encoding as shown in the example illustrated in FIG. 5. FIG. 5 is a diagram for describing an operation of the encoder among the components illustrated in FIG. 3. Conventionally, 128-bit unit data may be subject to error correction encoding by the encoder 120, and as shown in ①, the 128-bit unit data, for which error correction encoding has been implemented, and parity data are generated. According to an example embodiment, the protected scope is set according to an operation voltage of the memory 20. Accordingly, as shown in ②, a protected scope for 32 bits and an unprotected scope for 96 bits among the 128-bit unit data are set. The 32-bit protected data corresponding to the protected scope may be subject to error correction encoding by the encoder 120, and the 96-bit unprotected data corresponding to the unprotected scope may be processed to be zero (0) through zero-padding, and then, subject to error correction encoding. Eventually, the 32-bit protected data, for which error correction encoding has been implemented, and parity data are generated.

Figure 6:
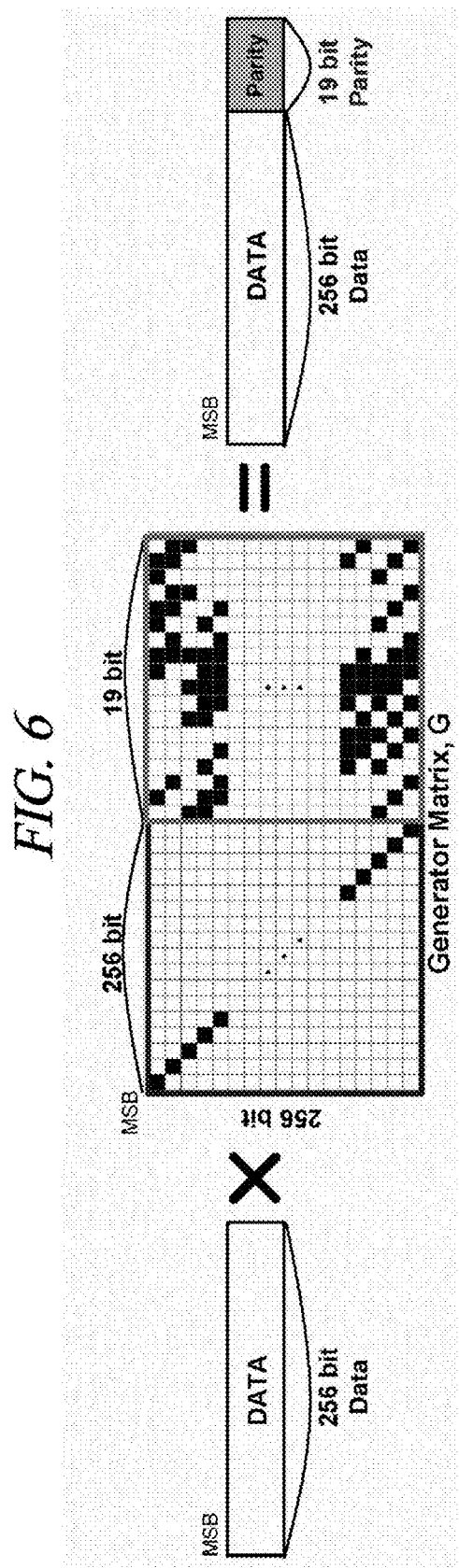
FIG. 6 is a diagram for specifically describing an encoding process by the encoder of FIG. 5.

More specifically, the encoder 120 may multiply data to be input by a generator matrix, so as to generate a code word including the data, for which error correction encoding has been implemented, and the parity data as shown in FIG. 6. FIG. 6 is a diagram for specifically describing the encoding process by the encoder. In this case, parity data may vary depending on a size of data to be input and the number of bits that can be corrected, and the generator matrix may consist of an identity matrix, by which data to be input are delivered as they are, and a parity matrix, which generates parity data.

The writer 130 writes the unit data in the memory 20 while matching them with the parity data generated according to the error correction encoding. With respect to the method, by which the writer 130 writes data in the memory 20, and the method, by which the writer 130 matches the unit data and the parity data with each other, conventionally known methods may be used, and the methods are not specifically limited.

The communication unit 140 receives a readout signal from the processor 10 that has delivered the unit data to the memory 20, and the readout signal is a signal for reading out the unit data written in the memory 20. In addition, the communication unit 140 receives information about the protected scope from the protected scope setting unit 110. In this case, the information about the protected scope may be a base material for determining which data of the unit data correspond to the protected data or the unprotected data, and delivered to the decoder 150.

The decoder 150 reads out the unit data corresponding to the readout signal and the parity data matching with the unit data corresponding to the readout signal, and implements error correction decoding for the protected data, for which error correction encoding has been implemented, based on the read-out parity data and the information about the protected scope.

Specifically, the decoder 150 may check whether an error has occurred in the protected data, for which error correction encoding has been implemented, based on the read-out parity data. Since the parity data are written in the memory 20 while matching with the unit data through the writer 130, the decoder 150 may read out the unit data corresponding to the readout signal and the parity data matching with the unit data. In addition, the decoder 150 may determine which data of the unit data corresponding to the readout signal correspond to the protected data, for which error correction encoding has been implemented, based on the information about the protected scope. In addition, the decoder 150 may check whether an error has occurred in the data that have been determined to correspond to the protected data, for which error correction encoding has been implemented, based on the read-out parity data. In this case, if it is determined that an error has occurred in the protected data, for which error correction encoding has been implemented, the decoder 150 may implement an operation for correcting the error.

Figure 7:
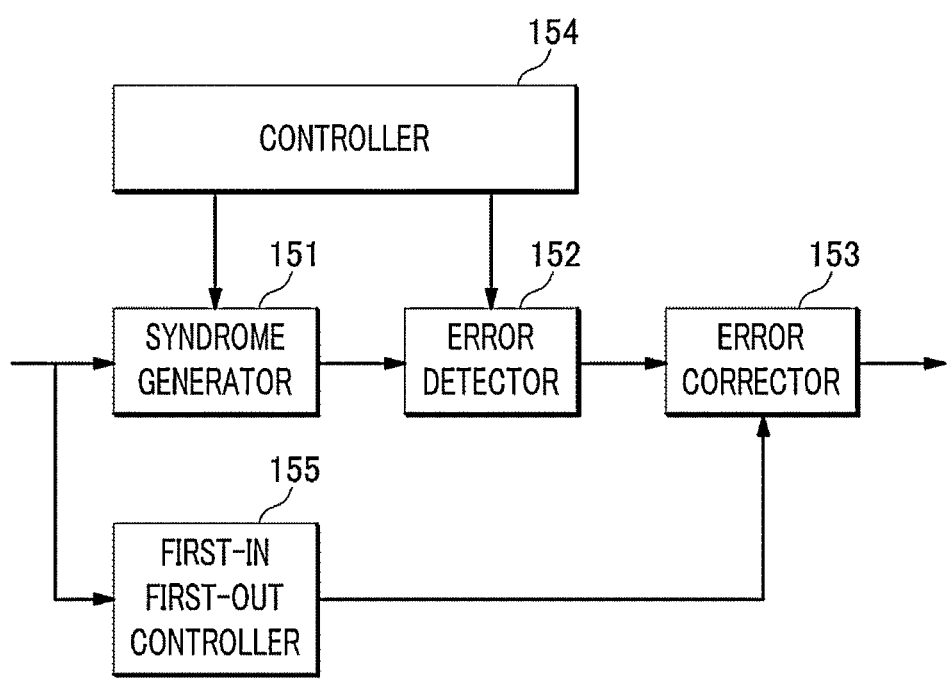
FIG. 7 is a diagram for describing a detailed structure of a decoder among the components illustrated in FIG. 3.

FIG. 7 is a diagram for describing a detailed structure of the decoder among the components illustrated in FIG. 3.

More specifically, the decoder 150 may include a syndrome generator 151, an error detector 152, an error corrector 153, a controller 154 and a first-in first-out (FIFO) controller 155.

The syndrome generator 151 may generate a syndrome from the unit data written in the memory 20, and the error detector 152 may detect a location of an error bit within the protected data, for which error correction encoding has been implemented, by using the generated syndrome and a polynomial. In addition, the Bose-Chaudhuri-Hocquenghem (BCH) code may be applied to the syndrome generator 151 and the error detector 152; and the error detector 152 may generate the polynomial by using the Berlekamp-Massey algorithm, and detect the location of the error bit by using the Chien search algorithm. Additionally, the error corrector 153 may correct the error bit by reversing a bit value of the error bit, and utilize the data delivered from the first-in first-out controller 155.

Figure 8:
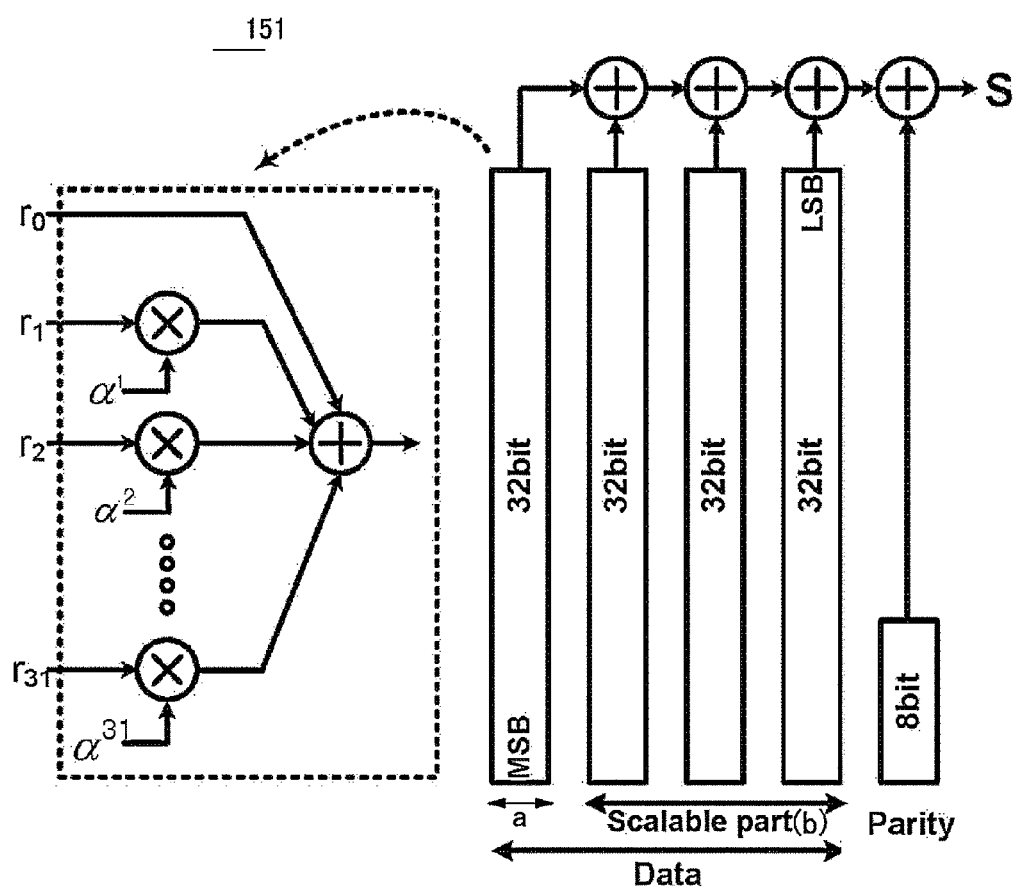
FIG. 8 is a diagram for describing a detailed structure of a syndrome generator among the components illustrated in FIG. 7.
Figure 9:
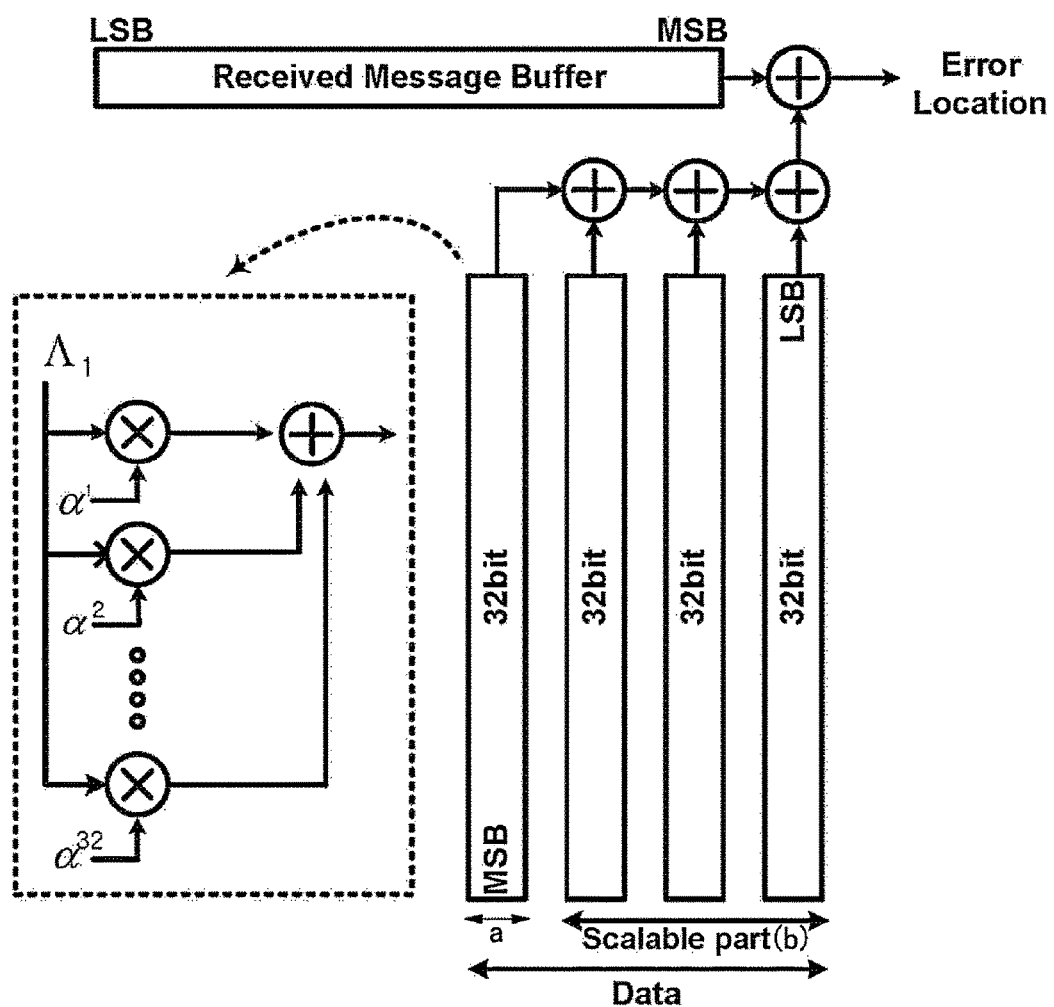
FIG. 9 is a diagram for describing a detailed structure of an error detector among the components illustrated in FIG. 7.

FIG. 8 is a diagram for describing a detailed structure of the syndrome generator among the components illustrated in FIG. 7, and FIG. 9 is a diagram for describing a detailed structure of the error detector among the components illustrated in FIG. 7.

The syndrome generator 151 may generate a syndrome S from the protected data, for which error correction encoding has been implemented, among the unit data written in the memory 20 as shown in FIG. 8. In addition, the controller 154 may control the syndrome generator 151 based on the information about the protected scope to stop the operation of generating a syndrome for the unprotected data b. In this case, the unprotected data b may mean data other than the protected data, for which error correction encoding has been implemented, among the unit data written in the memory 20. For example, the syndrome generator 151 may process maximum 128 bits, and the controller 154 may control the syndrome generator 151 depending on which of 32/64/96/128 bits is included in the protected scope for the unit data. If the protected scope has been set such that 32 bits in the vicinity of the most significant bit (MSB) are included in the protected data as in FIG. 8, the controller 154 may turn off the components for the unprotected data b within the syndrome generator 151, and transmit a control signal to enable the syndrome generator 151 to process the unprotected data b to be always zero (0). Accordingly, the error correction processing circuit 100 according to an example embodiment may minimize power consumption and calculation result errors.

In addition, the error detector 152 may detect a location of the error bit within the protected data a, for which error correction encoding has been implemented, through the Chien search algorithm of the BCH code as in FIG. 9. In addition, the controller 154 may control the error detector 152 based on the information about the protected scope to stop the operation of detecting the location of the error bit for the unprotected data b. In this case, the unprotected data b may mean data other than the protected data, for which error correction encoding has been implemented, among the unit data written in the memory 20. For example, the error detector 152 may process maximum 128 bits, and the controller 154 may control the error detector 152 depending on which of 32/64/96/128 bits is included in the protected scope for the unit data. If the protected scope has been set such that 32 bits in the vicinity of the most significant bit (MSB) are included in the protected data as in FIG. 9, the controller 154 may turn off the components for the unprotected data b within the error detector 152, and transmit a control signal to enable the error detector 152 to process the unprotected data b to be always zero (0). Accordingly, the error correction processing circuit 100 according to an example embodiment may minimize power consumption and calculation result errors.

Meanwhile, an error correction processing method according to an example embodiment is described with reference to FIG. 10 to FIG. 12.

Figure 10:
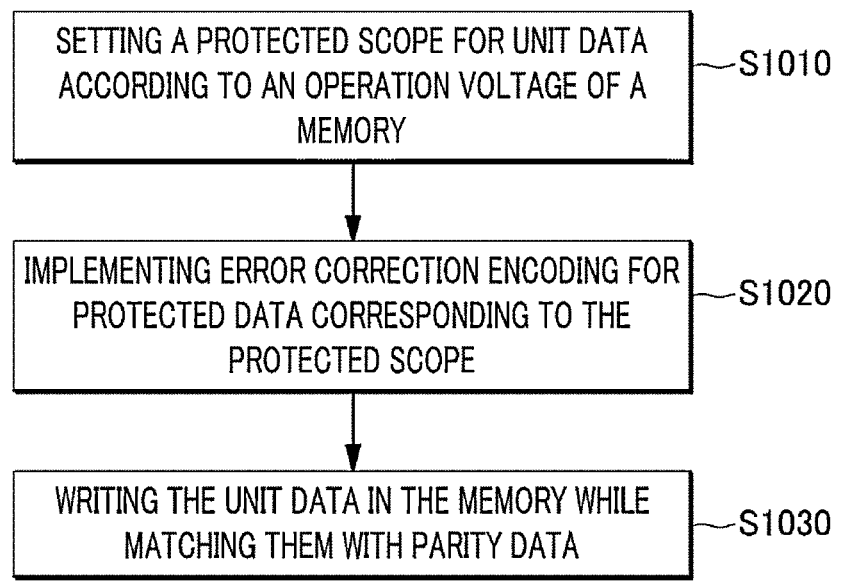
FIG. 10 is a flow chart for describing an error correction processing method according to an example embodiment.

FIG. 10 is a flow chart for describing an error correction processing method according to an example embodiment.

In order to correct and process an error occurring in a memory, the error correction processing circuit 100 or a certain circuit capable of implementing the same operation sets a protected scope for the unit data to be written in the memory 20 (S1010). In this case, the set protected scope may be in a relation dependent on the operation voltage of the memory 20, and in a relation proportional to the operation voltage of the memory 20. That is, the setting step S1010 may relatively reduce the protected scope as the operation voltage is low. Specifically, a protected scope for an operation voltage being lower than a predetermined value may be set to be lower than a protected scope for an operation voltage being higher than the predetermine value. In addition, the setting step S1010 may set the protected scope such that MSB is included in the protected data.

Subsequently, the error correction processing circuit 100 or a certain circuit capable of implementing the same operation implements error correction encoding for the protected data corresponding to the protected scope among the unit data (S1020). Specifically, the implementing step S1020 may implement error correction encoding by setting the unprotected data, which are data other than the protected data among the unit data, to zero (0). Through the zero-padding method, an error occurring in the data within the protected scope among errors occurring in the unit data may be absolutely corrected, and an error occurring in data within the unprotected scope may be disregarded. Since the protected scope may be set such that MSB is included in the protected data as described above, the zero-padding method may contribute to preventing occurrence of relatively fatal errors.

Subsequently, the above-described circuit writes the unit data in the memory 20 while matching them with parity data generated according to the error correction encoding (S1030). The unit data (protected data), for which error correction encoding has been implemented, and the parity data may be called a 'code word.'

Furthermore, a process for reading out the unit data written in the memory 20 is described hereinafter. The processes described below may be carried out after the writing step S1030 that has been described with reference to FIG. 10.

When the unit data written in the memory 20 are read out, the error correction processing circuit 100 or a certain circuit capable of implementing the same operation implements error correction decoding for the protected data, for which error correction encoding has been implemented. The error correction decoding is implemented based on the parity data matching with the unit data to be read out and the information about the protected scope.

Especially, the error correction decoding may be implemented by the above-described decoder 150 of the error correction processing circuit 100, and the error correction processing circuit 100 may transmit the information about the protected scope to the controller 154 of the decoder 150 prior to implementation of the error correction decoding. In addition, a readout signal including the information for the unit data desired to be read out might have been delivered from the processor 10.

In implementing the error correction decoding, the above-described circuit may implement the following processes. First, the circuit checks whether an error has occurred in the protected data, for which error correction encoding has been implemented, based on the parity data. In this case, if an error has occurred in the protected data, for which error correction encoding has been implemented, the circuit corrects the error.

Specifically, a syndrome is generated from the unit data written in the memory 20; a location of an error bit within the protected data, for which error correction encoding has been implemented, is detected by using the generated syndrome; and the error bit may be corrected by reversing a bit value of the error bit. For the data, of which the error has been corrected through the process of correcting the error bit, error correction decoding may be implemented. Subsequently, the above-described circuit may transmit, to the processor 10 that has delivered the unit data to the memory 20, the resulting data of the error correction decoding and the unprotected data, which are data other than the protected data, for which error correction encoding has been implemented, among the unit data written in the memory 20.

Figure 11:
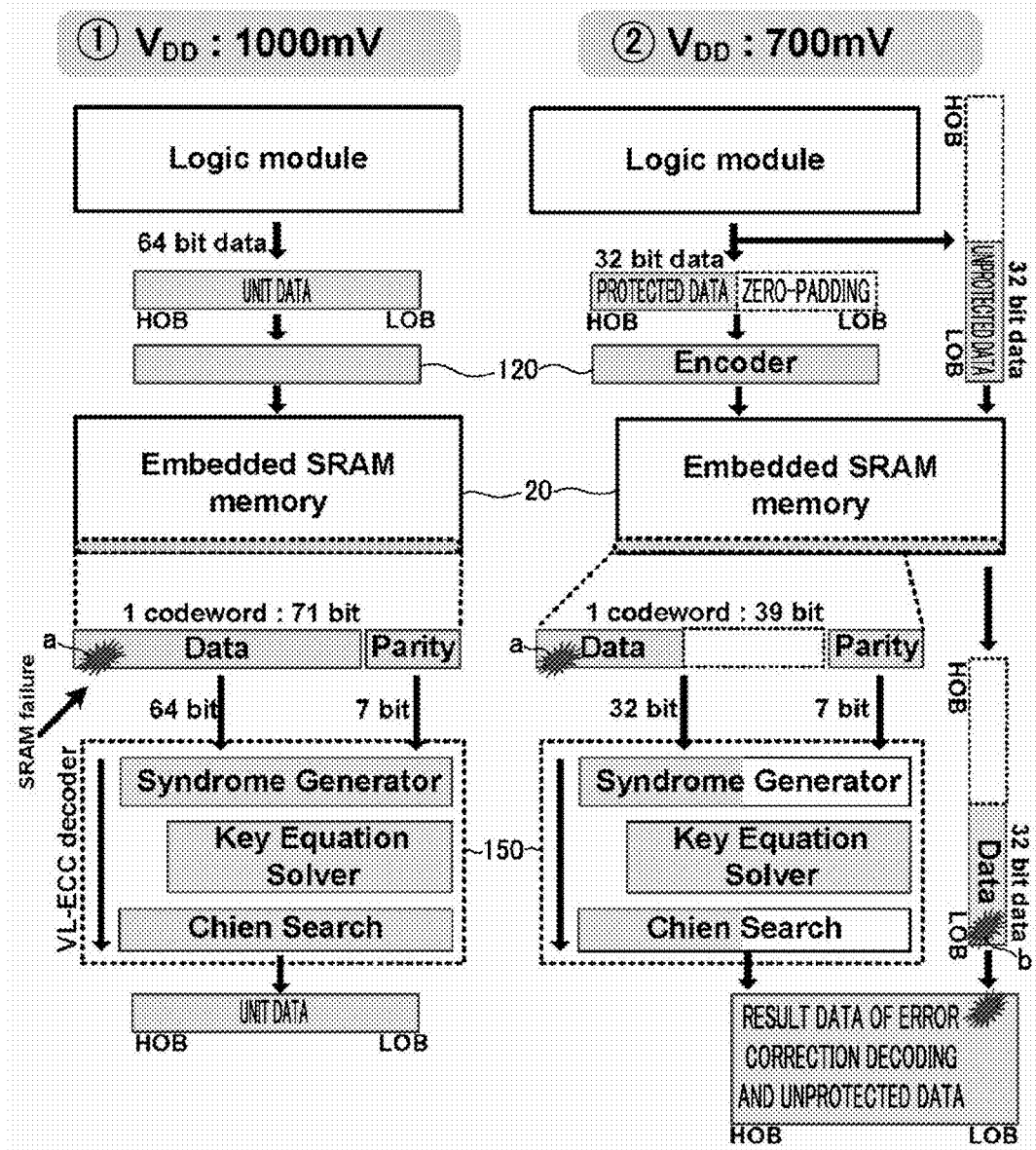
FIG. 11 is a diagram for describing a process of correcting and processing an error occurring in a memory in each of the case where an operation voltage of a memory is 1,000 mV and the case where an operation voltage of a memory is 700 mV.

The error correction processing method according to an example embodiment is described by using specific examples illustrated in FIG. 11. FIG. 11 is a diagram for describing a process of correcting and processing an error occurring in the memory in each of the case where an operation voltage of the memory is 1,000 mV and the case where an operation voltage of the memory is 700 mV.

① of FIG. 11 shows a process, in which a conventional circuit corrects and processes an error occurring in unit data having 64 bits of one word data length when the operation voltage of the memory 20 is 1,000 mV. The encoder 120 encodes the whole 64-bit unit data, and the writer 130 writes a codeword including the unit data, for which encoding has been implemented, and the parity data in the memory 20. Thereafter, the decoder 150 reads out the written codeword based on a readout signal and implements a decoding process to obtain the unit data. However, an error a may occur within the codeword; the conventional method cannot guarantee correction and processing of the error a; and the unit data to be finally obtained may have a fatal error due to the error a.

② of FIG. 11 shows a process, in which the error correction processing circuit 100 corrects and processes an error occurring in the unit data after the setting of the protected scope when the operation voltage of the memory 20 is 700 mV. The protected scope setting unit 110 sets 32 bits of the 64-bit unit data as the protected scope, and the encoder 120 processes the other 32 bits corresponding to the unprotected scope to be zero (0) (zero-padding). The encoder 120 implements error correction encoding only for the 32-bit protected data. In addition, the writer 130 writes each of the codeword including the protected data, for which error correction encoding has been implemented, and the parity data, and the unprotected data in the memory 20. Thereafter, the decoder 150 reads out the written codeword and the unprotected data based on the readout signal. Subsequently, the decoder 150 implements the decoding process based on the parity data matching with the unit data to be read out and the information about the protected scope so as to obtain resulting data of the error correction decoding and the unprotected data. In this case, the resulting data of the error correction decoding and the unprotected data are substantially identical to the initial unit data. The error a occurring within the codeword is clearly corrected by the error correction processing circuit 100. The error a occurring within the unprotected data cannot be corrected by the error correction processing circuit 100, but since the unprotected data are the bit of relatively low importance compared to the corrected bit, the error correction processing circuit 100 can prevent a fatal error.

Meanwhile, each of the components illustrated in FIG. 3 may consist of a kind of 'module.' The 'module' means a software element or a hardware element like a field programmable gate array (FPGA) or an application specific integrated circuit (ASIC), and performs certain functions. However, the module is not limited to software or hardware. The module may be configured to be placed in an addressable storage medium or execute one or more processors. The components and the functions provided by the modules may be combined with one another to be a less number of components or modules or divided into further components or modules.

The memory 20 illustrated with reference to FIG. 3 may be realized as at least one of nonvolatile memory devices such as a read only memory (ROM), a programmable ROM (PROM), an erasable programmable ROM (EPROM), an electrically erasable programmable ROM (EEPROM), and a flash memory, volatile memory devices such as a cache, or a random access memory (RAM), or storage media such as a hard disk drive (HDD) and a CD-ROM, but is not limited thereto.

Hereinafter, an example for actually applying the error correction processing circuit and the error correction processing method according to an example embodiment is described.

Figure 12:
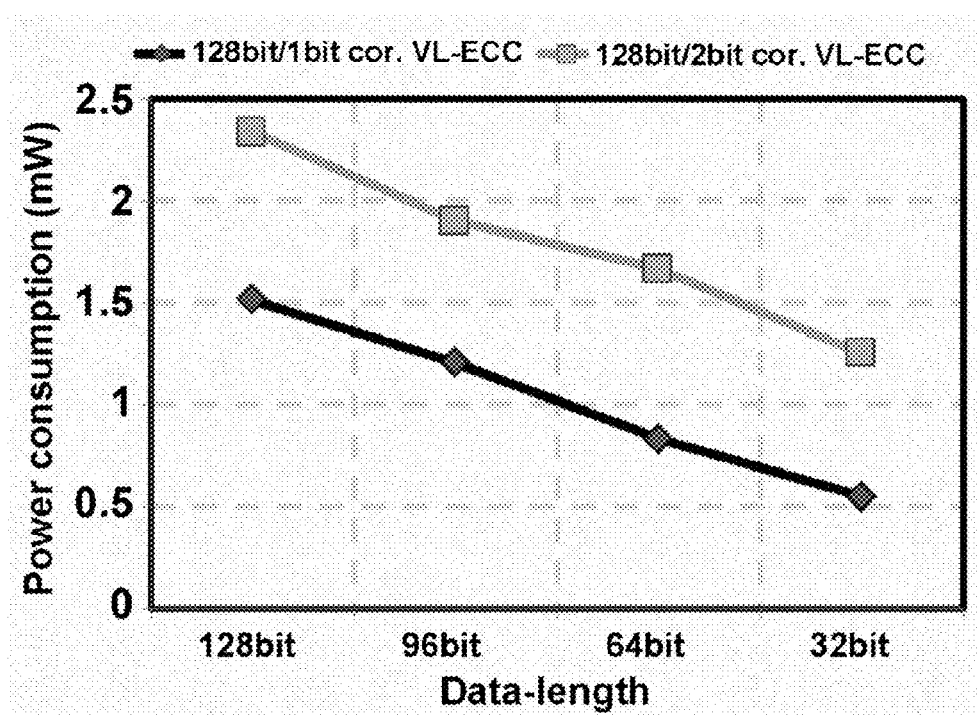
FIG. 12 is a graph showing an effect that can be obtained from the control in FIG. 8 and FIG. 9.

FIG. 12 is a graph showing an effect that can be obtained through the control shown in FIG. 8 and FIG. 9.

As described above, the controller 154 may turn off the components for the unprotected data b within the syndrome generator 151, and transmit a control signal to enable the syndrome generator 151 to process the unprotected data b to be always zero (0) as in FIG. 8. In addition, the controller 154 may turn off the components for the unprotected data b within the error detector 152, and transmit a control signal to enable the error detector 152 to process the unprotected data b to be always zero (0) as in FIG. 9. As a result, power consumption in the decoder 150 can be reduced according to the data length to be turned-off as in FIG. 12.

Figure 13:
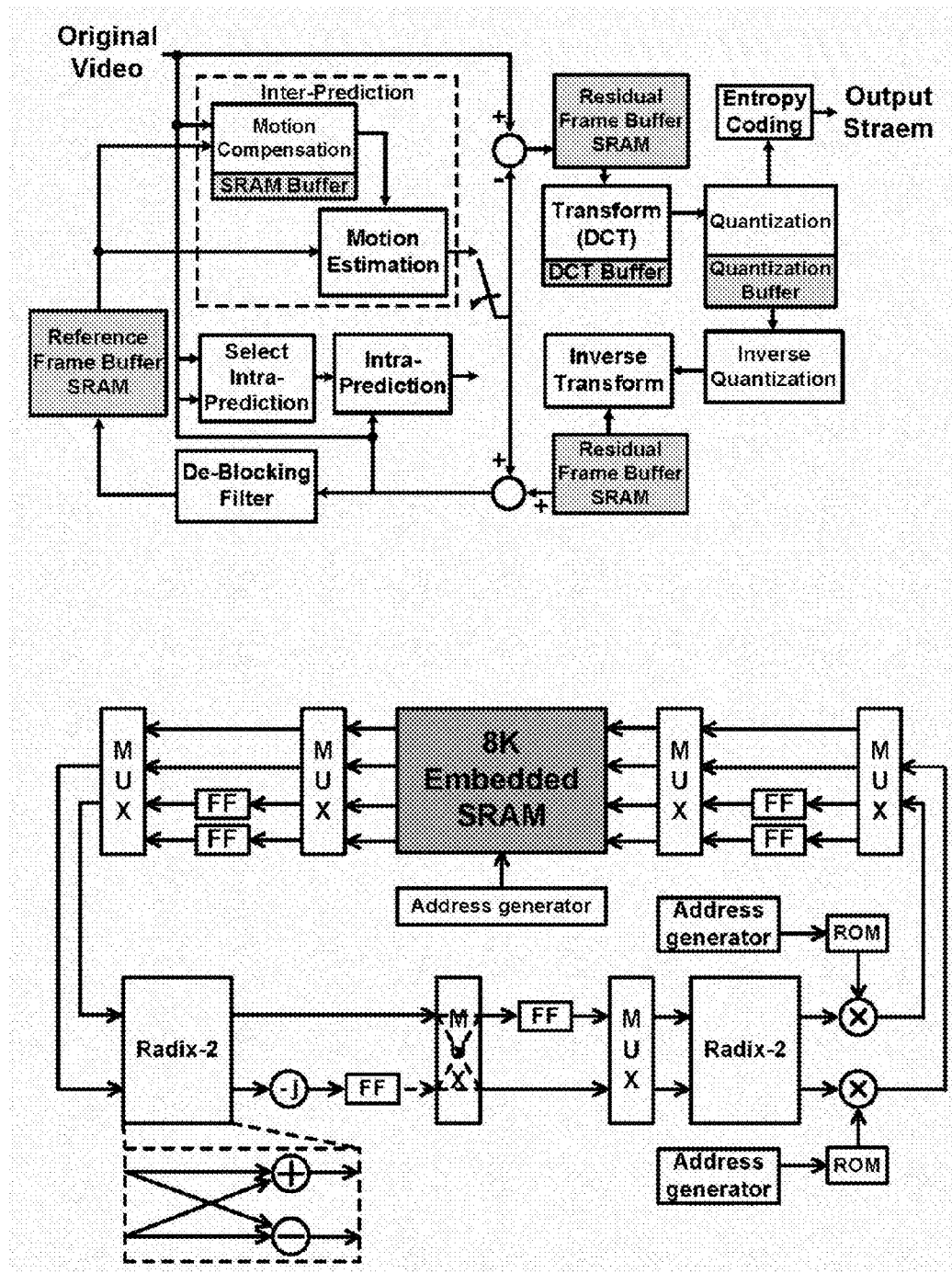
FIG. 13 is a diagram for describing a position, to which the error correction processing circuit illustrated in FIG. 3 can be actually applied, in a H.264 circuit and a FFT processing circuit.

FIG. 13 is a diagram for describing a location, to which the error correction processing circuit illustrated in FIG. 3 can be actually applied, in a H.264 circuit and a FFT processing circuit. The upper block diagram of FIG. 13 schematically illustrates a structure of the H.264 circuit, and the error correction processing circuit 100 suggested in the example embodiments may be actually applied to a residual frame buffer (SRAM), a DCT buffer, a quantization buffer and others. The lower block diagram of FIG. 13 schematically illustrates a structure of the FFT processing circuit, and the error correction processing circuit 100 suggested in the example embodiments may be actually applied to a 8K embedded SRAM and others. The examples illustrated in FIG. 13 are merely applicable examples, and the present disclosure is not limited to the examples of FIG. 13.

Figure 14:
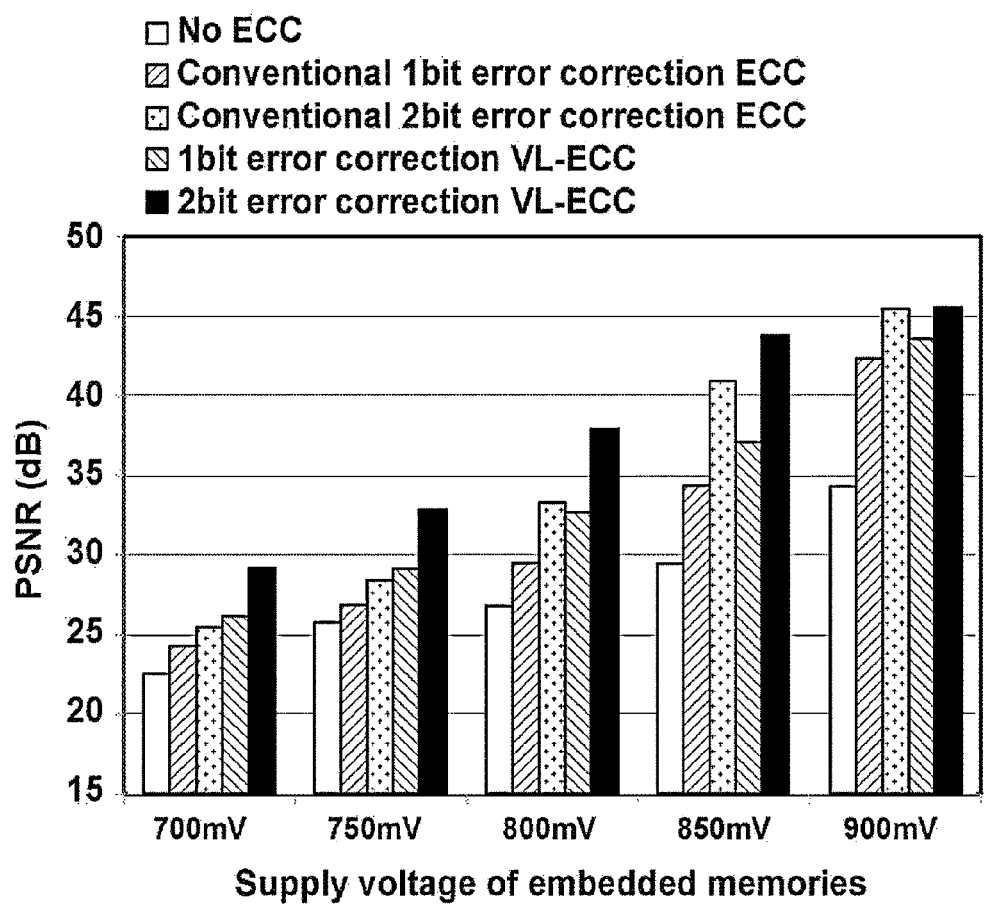
FIG. 14 is a graph showing a performance change when an error correction processing circuit and a method thereof are applied to the H.264 circuit.

FIG. 14 is a graph showing a performance change when the error correction processing circuit and the method thereof are applied to the H.264 circuit. Since the H.264 circuit or module implements an image compression operation, an operation quality can be determined through a peak signal to noise ratio (PSNR) of a resulting image. It can be confirmed that the performance when the method (VL-ECC) suggested in the example embodiments is applied is more superior than the performance when the conventional Bose-Chaudhuri-Hocquenghem (BCH) code method (conventional ECC) is applied, and that the improvement in performance becomes significant as an operation voltage to be applied is low.

Figure 15:
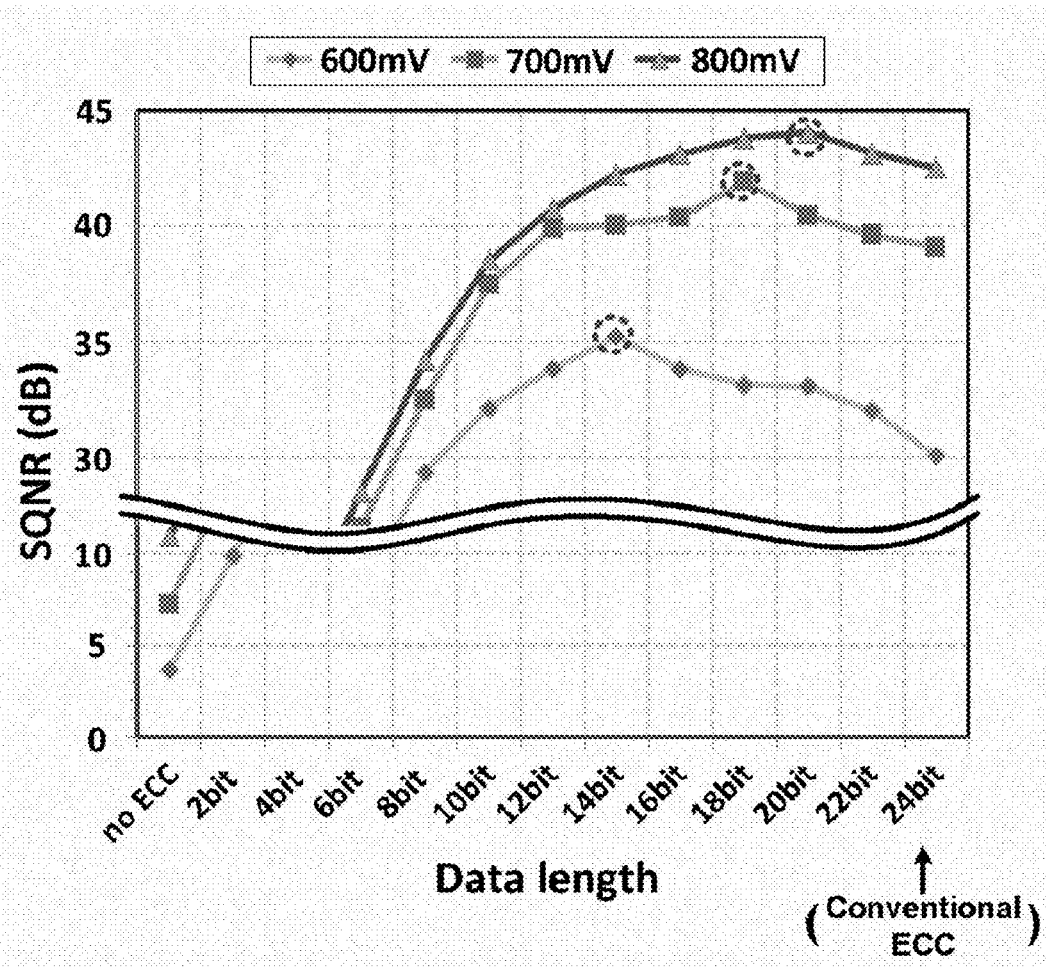
FIG. 15 is a graph showing a performance change when an error correction processing circuit and a method thereof are applied to the FFT processing circuit.

FIG. 15 is a graph showing a performance change when the error correction processing circuit and the method thereof are applied to the FFT processing circuit. An output quality was measured by using a signal to quantization noise ratio (SQNR) while changing a data length in the FFT processing circuit, in which one word is 24 bits. It can be confirmed that for the part corresponding to the 24 bits, the performance when the method (VL-ECC) suggested in the example embodiments is applied is far more superior than the performance when a conventional BCH code method (conventional ECC) is applied.

The above description of the example embodiments is provided for the purpose of illustration, and it would be understood by those skilled in the art that various changes and modifications may be made without changing technical conception and essential features of the example embodiments. Thus, it is clear that the above-described example embodiments are illustrative in all aspects and do not limit the present disclosure. For example, each component described to be of a single type can be implemented in a distributed manner. Likewise, components described to be distributed can be implemented in a combined manner.

The scope of the inventive concept is defined by the following claims and their equivalents rather than by the detailed description of the example embodiments. It shall be understood that all modifications and embodiments conceived from the meaning and scope of the claims and their equivalents are included in the scope of the inventive concept.

We claim:
1. A method for correcting error in an error correction code circuit included in a memory, comprising:
   setting a protected scope for at least part of unit data to be written in the memory according to a magnitude of an operation voltage of the memory;
   implementing error correction encoding for protected data corresponding to the protected scope;
   writing the unit data in the memory while matching them with parity data generated as a result of the error correction encoding; and
   transmitting information about the protected scope to a controller of a decoder implementing error correction decoding for the protected data, for which the error correction encoding has been implemented,
   wherein the setting step sets the protected scope being smaller, as the operation voltage decreases,
   wherein the setting step sets the protected scope such that a most significant bit (MSB) is included in the protected data, and the protected data includes a numbers of bits of the unit data and the numbers of bits are adjacent to each other, and
   wherein the step of implementing the error correction decoding comprises: checking whether an error has occurred in the protected data, for which the error correction encoding has been implemented, based on the parity data; and correcting the error, which has occurred in the protected data, for which the error correction encoding has been implemented.

2. The method of claim 1, wherein the implementing step comprises implementing the error correction encoding by setting unprotected data, which are data other than the protected data among the unit data, to zero (0).

3. The method of claim 1, further comprising when the unit data written in the memory are read out, implementing error correction decoding for the protected data, for which the error correction encoding has been implemented, based on parity data matching with the read-out unit data and the information about the protected scope.

4. The method of claim 1, wherein the correcting step comprises:
generating a syndrome from the unit data written in the memory;
detecting a location of an error bit within the protected data, for which the error correction encoding has been implemented, by using the generated syndrome.

5. The method of claim 1, further comprising:
implementing the error correction decoding for the data, of which the error has been corrected in the correcting step; and
transmitting, to the processor that has delivered the unit data to the memory, resulting data of the error correction decoding and the unprotected data,
wherein the transmitted unprotected data are data other than the protected data, for which the error correction encoding has been implemented, among the unit data written in the memory.

6. An error correction code circuit included in a memory, comprising:
a protected scope setting unit that sets a protected scope for at least part of unit data to be written in the memory according to an operation voltage of the memory;
an encoder that implements error correction encoding for protected data corresponding to the protected scope and including a most significant bit (MSB) among the unit data;
a writer that writes the unit data in the memory while matching them with parity data generated as a result of the error correction encoding;
a communication unit that receives a readout signal to read out the unit data written in the memory from a processor delivering the unit data to the memory, and receives information about the protected scope from the protected scope setting unit; and
a decoder that reads out the unit data corresponding to the readout signal and parity data matching with the unit data corresponding to the readout signal, and implements error correction decoding for the protected data, for which the error correction encoding has been implemented, based on the parity data and the information about the protected scope,
wherein the protected scope setting unit sets the protected scope being smaller, as the operation voltage decreases,
wherein the setting step sets the protected scope such that a most significant bit (MSB) is included in the protected data, and the protected data includes a numbers of bits of the unit data and the numbers of bits are adjacent to each other, and
wherein the decoder checks whether an error has occurred in the protected data, for which the error correction encoding has been implemented, based on the parity data, and corrects the error if the error has occurred.

7. The circuit of claim 6, wherein the decoder comprises:
a syndrome generator, to which the Bose-Chaudhuri-Hocquenghem (BCH) code is applied, and which generates a syndrome from the unit data written in the memory;
an error detector, to which the BCH code is applied, and which detects a location of an error bit within the protected data, for which the error correction encoding has been implemented, by using the generated syndrome; and
an error corrector that corrects the error bit by reversing a bit value of the error bit.

8. The circuit of claim 7, wherein the syndrome generator generates the syndrome from the protected data, for which the error correction encoding has been implemented, among the unit data written in the memory, and
the circuit further comprises a controller that controls the syndrome generator based on the information about the protected scope to stop the operation of generating the syndrome for unprotected data, which are data other than the protected data, for which the error correction encoding has been implemented.

9. The circuit of claim 7, wherein the error detector is realized by using the Berlekamp-Massey algorithm and the Chien search algorithm.

10. The circuit of claim 9, wherein the error detector detects a location of the error bit within the protected data, for which the error correction encoding has been implemented, through the Chien search algorithm of the BCH code, and
the circuit further comprises a controller that controls the error detector based on the information about the protected scope to stop the operation of detecting a location of the error bit for unprotected data, which are data other than the protected data, for which the error correction encoding has been implemented, among the unit data written in the memory.

* * * * *